(12) United States Patent
Hasnat et al.

(10) Patent No.: US 10,861,867 B2
(45) Date of Patent: Dec. 8, 2020

(54) MEMORY DEVICE WITH REDUCED CAPACITANCE

(71) Applicant: Intel Corporation, Santa Clara, CA (US)

(72) Inventors: Khaled Hasnat, San Jose, CA (US); Prashant Majhi, San Jose, CA (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/021,550

(22) Filed: Jun. 28, 2018

(65) Prior Publication Data
US 2019/0043882 A1 Feb. 7, 2019

(51) Int. Cl.
*H01L 27/11582* (2017.01)
*H01L 23/532* (2006.01)
(Continued)

(52) U.S. Cl.
CPC .... *H01L 27/11582* (2013.01); *H01L 21/7682* (2013.01); *H01L 23/528* (2013.01); *H01L 23/5329* (2013.01); *H01L 29/40117* (2019.08); *H01L 29/495* (2013.01); *H01L 29/4916* (2013.01); *H01L 29/513* (2013.01); *H01L 29/518* (2013.01); *H01L 29/66833* (2013.01); *H01L 29/7926* (2013.01); *H01L 21/0217* (2013.01); *H01L 21/02271* (2013.01); *H01L 21/3065* (2013.01); *H01L 21/31053* (2013.01); *H01L 21/32133* (2013.01); *H01L 24/16* (2013.01); *H01L 29/66545* (2013.01);
(Continued)

(58) Field of Classification Search
CPC ......... H01L 27/11582; H01L 29/66833; H01L 29/7926; H01L 29/40117; H01L 23/5329; H01L 29/495; H01L 29/4916; H01L 21/7682; H01L 29/513; H01L 29/518; H01L 23/528; H01L 21/31053; H01L 24/16; H01L 2224/16225; H01L 2924/1438; H01L 2924/14511; H01L 29/66545; H01L 21/3065; H01L 21/32133; H01L 21/0217; H01L 21/02271; H01L 2924/00014; H01L 2224/73204; H01L 2224/48227; H01L 24/48; H01L 2224/16227; H01L 24/13; H01L 24/32; H01L 2224/32225
See application file for complete search history.

(56) References Cited

U.S. PATENT DOCUMENTS 9,666,525 B2 * 5/2017 Kim .................... H01L 23/5226
10,141,221 B1 * 11/2018 Lai ....................... H01L 21/7682
(Continued)

*Primary Examiner* — Su C Kim
(74) *Attorney, Agent, or Firm* — Schwabe, Williamson & Wyatt, P.C.

(57) ABSTRACT

Embodiments of the present disclosure are directed towards techniques to provide a memory device with reduced capacitance. In one embodiment, a memory array is formed in a die, and includes one or more pillars and a plurality of wordlines coupled with the one or more pillars. Adjacent wordlines of the plurality of wordlines are separated by respective dielectric layers, which may include components, to reduce capacitance of the plurality of wordlines. The components comprise air gaps or low-k dielectric material. Other embodiments may be described and/or claimed.

14 Claims, 7 Drawing Sheets

(51) Int. Cl.
*H01L 29/49* (2006.01)
*H01L 21/768* (2006.01)
*H01L 29/51* (2006.01)
*H01L 23/528* (2006.01)
*H01L 21/28* (2006.01)
*H01L 29/66* (2006.01)
*H01L 29/792* (2006.01)
H01L 21/3105 (2006.01)
H01L 23/00 (2006.01)
H01L 21/3065 (2006.01)
H01L 21/3213 (2006.01)
H01L 21/02 (2006.01)

(52) U.S. Cl.
CPC ............... *H01L 2224/16225* (2013.01); *H01L 2924/1438* (2013.01); *H01L 2924/14511* (2013.01)

(56) References Cited

U.S. PATENT DOCUMENTS

| 2013/0148398 A1* | 6/2013 | Baek ................. H01L 27/11568 365/51 |
| 2016/0118396 A1* | 4/2016 | Rabkin ................ H01L 29/518 257/314 |
| 2016/0268293 A1* | 9/2016 | Kamigaichi ...... H01L 27/11582 |
| 2017/0062330 A1* | 3/2017 | Kim .................... H01L 23/5226 |
| 2018/0108664 A1* | 4/2018 | Lee .................. H01L 27/11524 |
| 2018/0269181 A1* | 9/2018 | Yang ................. H01L 25/0655 |

\* cited by examiner

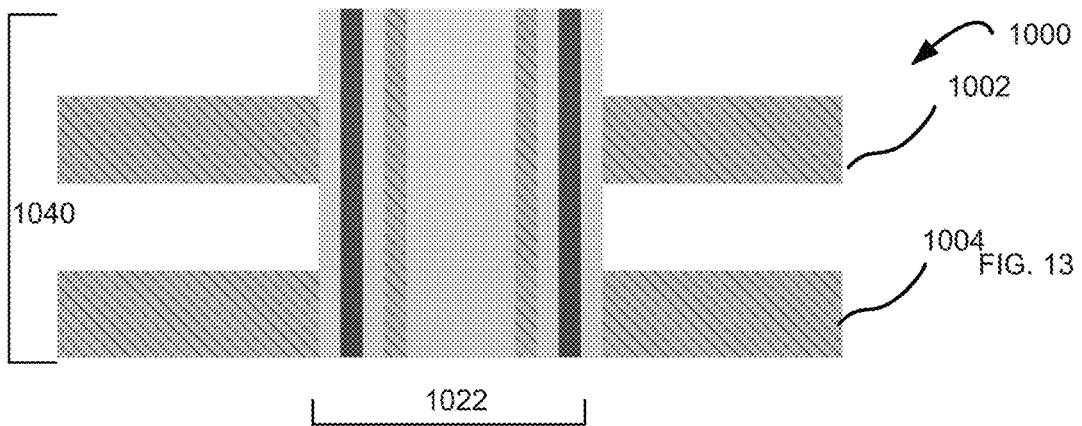
FIG. 13
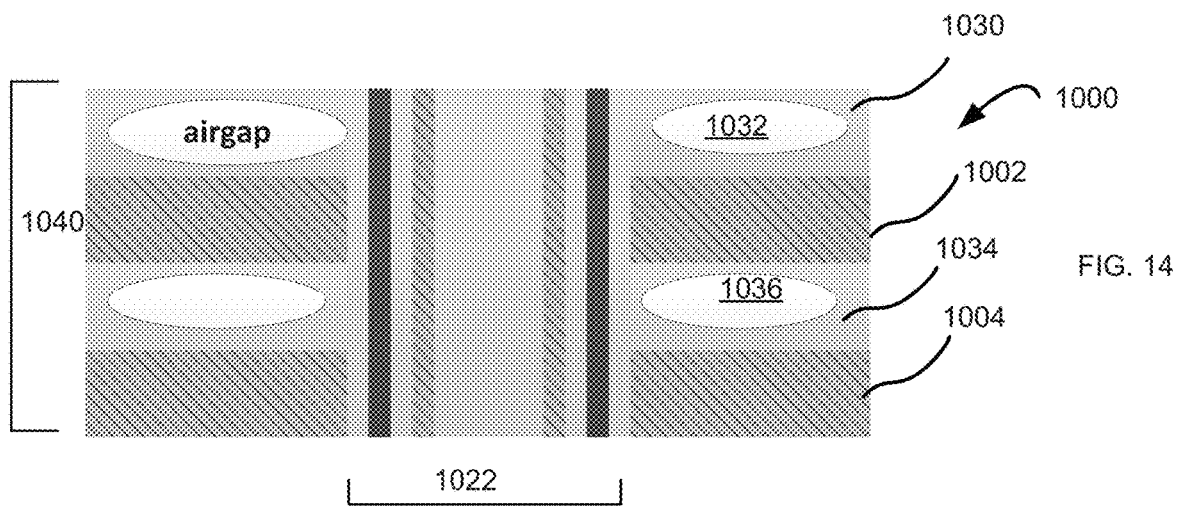
FIG. 14
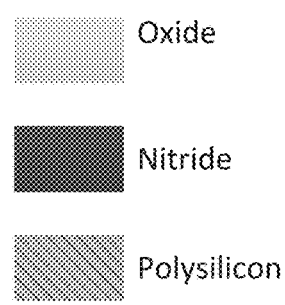

US 10,861,867 B2

MEMORY DEVICE WITH REDUCED CAPACITANCE

FIELD

Embodiments of the present disclosure generally relate to the field of integrated circuits (IC), and more particularly, to fabrication techniques for a non-volatile memory device with reduced capacitance.

BACKGROUND

A typical flash memory device may comprise a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another. Each group of memory cells may share a plurality of access lines, known as wordlines (WLs) and bitlines (BLs).

In memory technology, particularly in 3D NAND memory technology, wordline capacitance is a key parameter that determines product performance. In the current 3D NAND array architecture, the wordlines comprise a larger conductive sheet separated by thin dielectrics. For example, wordlines in a 3D NAND array may be separated by continuous dielectric like SiO2. Having a large wordline area that includes multiple dielectric separation layers may result in a large capacitance in the memory array. This large capacitance may add significant delay in the array performance, which may be manifested in slower read and write speed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3-14 illustrate example processes of forming a memory device with reduced capacitance, in accordance with some embodiments.

DETAILED DESCRIPTION

Figure 1:
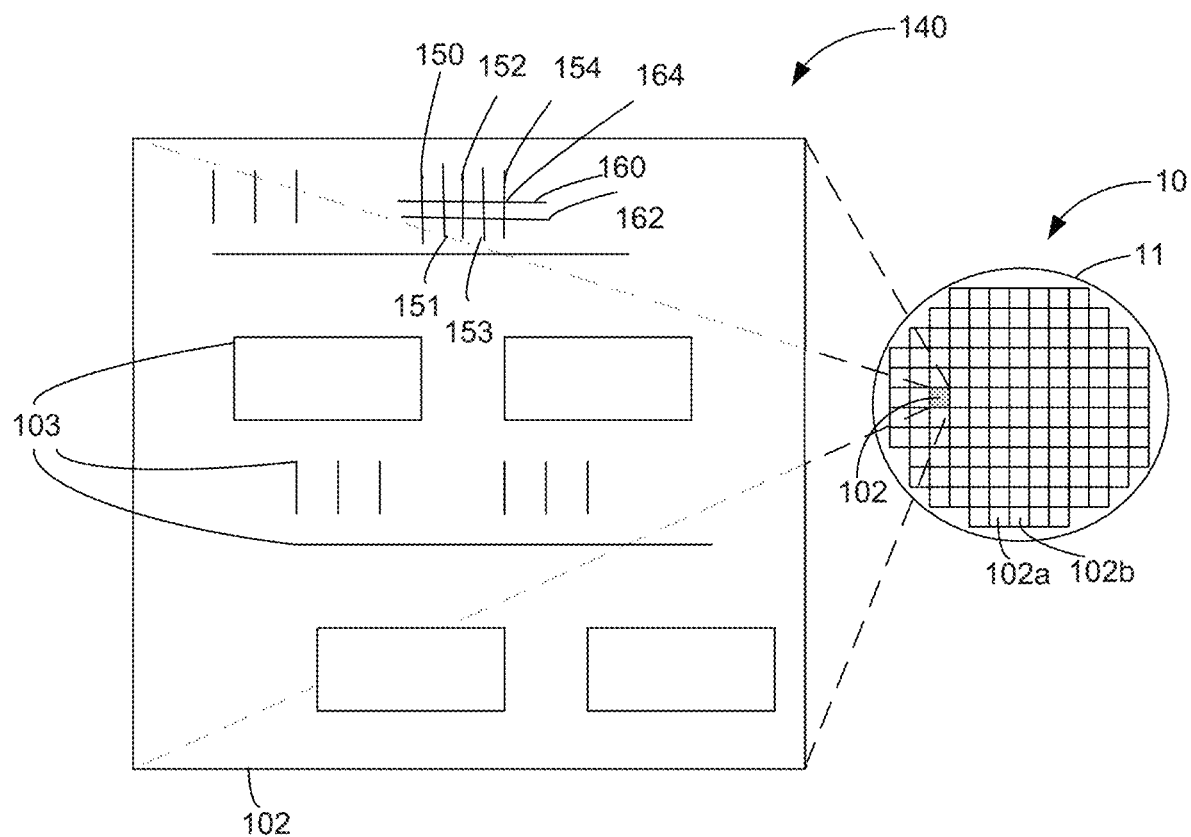
FIG. 1 illustrates an example die in which a memory device may be provided using the techniques of the present disclosure, in accordance with some embodiments.

Embodiments of the present disclosure describe techniques and configurations for a memory device comprising a memory array with reduced capacitance. In embodiments, the memory array is formed in a die, and includes one or more pillars and a plurality of wordlines coupled with the one or more pillars. Adjacent wordlines of the plurality of wordlines are separated by respective dielectric layers, which may include components, to reduce capacitance of the plurality of wordlines. The components comprise air gaps or low-k dielectric material.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 illustrates an example die in which a memory device may be provided using the techniques of the present disclosure, in accordance with some embodiments. More specifically, FIG. 1 schematically illustrates a top view of die 102 in wafer form 10 and in singulated form 140, in accordance with some embodiments. In some embodiments, the die 102 may be one of a plurality of dies (e.g., die 102, 102*a*, 102*b*) of a wafer 11 composed of semiconductor material such as, for example, silicon or other suitable material. The plurality of dies may be formed on a surface of the wafer 11. Each of the dies may be a repeating unit of a semiconductor product that may include a memory device as described herein. For example, the die 102 may include circuitry 103 of a memory device in accordance with some embodiments. According to various embodiments, the circuitry 103 may include one or more memory elements (cells), which may be configured in an array, such as a two-dimensional (2D) or three-dimensional non-volatile memory array. In some embodiments, the memory array may comprise a cross-point memory array. The memory elements may include, for example, phase change memory (PCM) elements, resistive random-access memory (RRAM) elements, spin-transfer torque magnetic random-access memory (STTRAM) elements or other suitable devices. The circuitry 103 may further include memory element access devices, or switches, such as, for example, an ovonic threshold switch (OTS), threshold vacuum switch, silicon or oxide based P-N diode, or other switching devices configured for use in selection/programming operations of the memory elements.

The circuitry 103 may further include one or more wordlines (e.g., 150, 152, 154) and one or more bitlines (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. In 3D embodiments, the memory elements may be stacked on each other in a pillar fashion.

A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions such as read, program, verify and/or analysis operations.

In some embodiments, such as in a 3D NAND memory array, adjacent wordlines (e.g., 150 and 152, and 152 and 154) may be separated by respective dielectric layers (e.g., 151 and 153). The dielectric layers may include components provided inside the dielectric layers, to reduce capacitance of the plurality of wordlines, in accordance with some embodiments of the present disclosure. These and other aspects will be further described below.

In some embodiments, the circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In some embodiments, the die 102 may include logic or memory, or combinations thereof.

Figure 2:
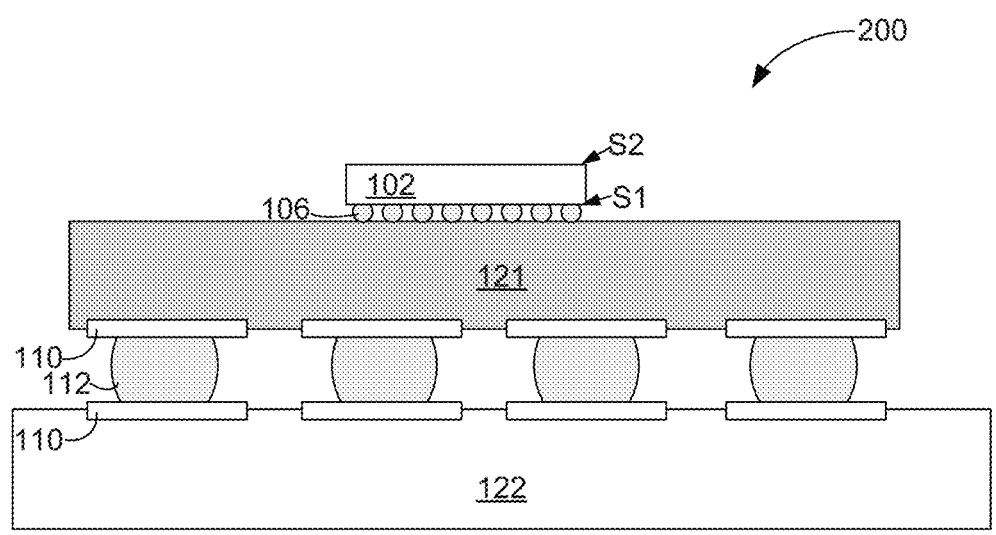
FIG. 2 schematically illustrates a cross-section side view of an integrated circuit (IC) assembly that includes a memory device provided using the techniques of the present disclosure, in accordance with some embodiments.

FIG. 2 schematically illustrates a cross-section side view of an integrated circuit (IC) assembly 200 that includes a memory device provided in accordance with some embodiments described herein. In some embodiments, the IC assembly 200 includes one or more dies (e.g., die 102 of FIG. 1) electrically and/or physically coupled with a package substrate 121. In some embodiments, the die 102 may be, include, or be a part of an IC including a memory, processor, System on Chip (SoC) or application-specific integrated circuit (ASIC). For example, the die 102 may include circuitry (e.g., circuitry 103 of FIG. 1) such as a memory device as described herein. The die 102 may represent a discrete product made from a semiconductor material (e.g., silicon) using semiconductor fabrication techniques such as thin film deposition, lithography, etching and the like used in connection with forming memory devices. In some embodiments, an electrically insulative material such as, for example, molding compound or underfill material (not shown) encapsulates at least a portion of the die 102 and/or die-level interconnect structures 106.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device.

Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like.

In embodiments, the die 102 of the IC assembly 200 may be, include, or be a part of an IC including a memory device as described herein. The process of fabrication of a memory device comprising circuitry 103 in a die, such the die 102, according to the techniques of the present disclosure is described in reference to FIGS. 3-15.

FIGS. 3-14 illustrate example processes of forming a memory device with reduced capacitance, in accordance with some embodiments. More specifically, FIGS. 3-14 schematically illustrate example cross-section side views of a memory device, showing different stages of the process forming a memory array, in accordance with some embodiments. It will be understood that various features of a memory device, e.g., electrical routing features, interconnect structures, and the like, that may be formed in the memory device manufacturing process, are not shown in FIGS. 3-14 for ease of understanding. Also for ease of understanding, the like elements of the memory device depicted in FIG. 3-14 are enumerated with like numerals. The fabrication process of a memory device is described in application to the wordline formation in the memory array, such as, for example, a 3D NAND memory array. It is noted that a similar process may be applied to fabrication of bitlines of the memory array and is omitted herein for brevity.

FIGS. 3-9 describe an example process of forming a memory array with metal gates, with reduced capacitance, in accordance with some embodiments.

Figure 3:
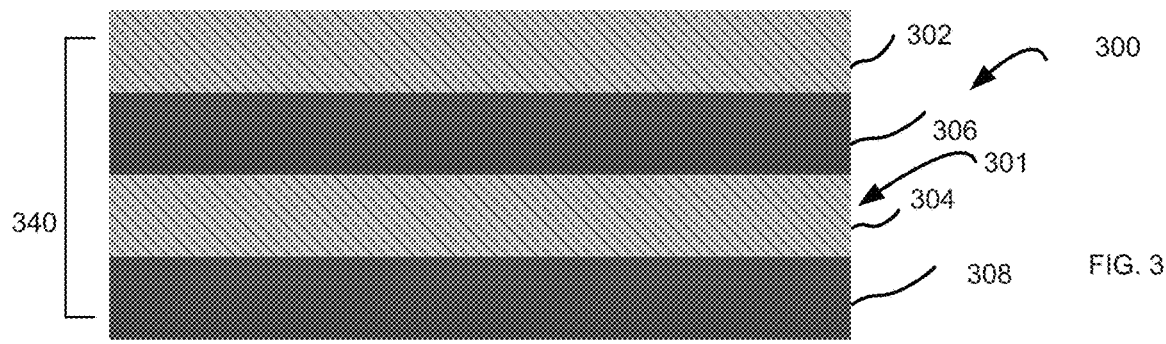

Referring to FIG. 3, a memory device 300 is depicted subsequent to a tier deposition of layers that may form a plurality of wordlines, comprising at least in part a memory array in a die 301. More specifically, the memory device 300 is depicted subsequent to a deposition of polysilicon layers 302, 304 with respective disposable layers 306, 308 (e.g., comprising nitride or other suitable material) between the polysilicon layers to ensure structural integrity of the memory device. The disposable layers may be replaced by a gate material later in the process. The layers 302, 304, 306, and 308 form a layer structure 340, comprising alternating polysilicon and nitride layers. Only four layers of the structure 340 are depicted in FIG. 3 (and subsequent figures) for ease of understanding. It will be understood that multiple layers (e.g., up to 96) may be provided in the memory device 300, in a formation depicted in FIGS. 3-9 (and 10-14).

Figure 4:
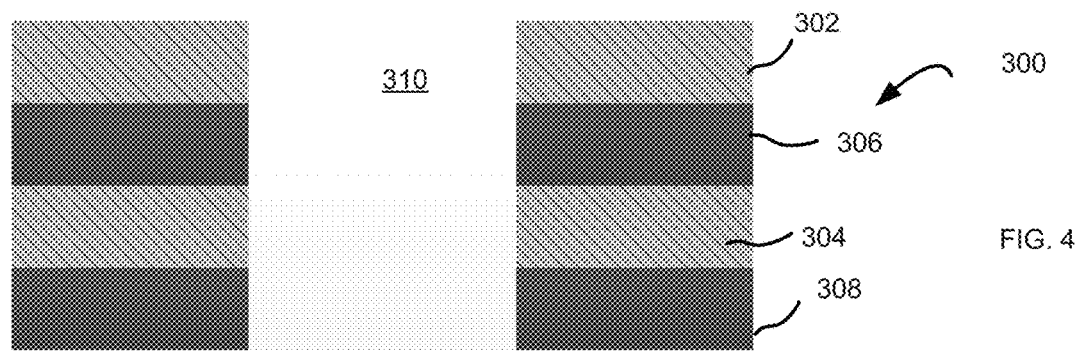

In FIG. 4, the memory device 300 is depicted subsequent to etching pillar holes to form pillars (e.g., space 310) in the layered structure of FIG. 3. The pillar etching may be provided through a dry etch process, for example.

Figure 5:
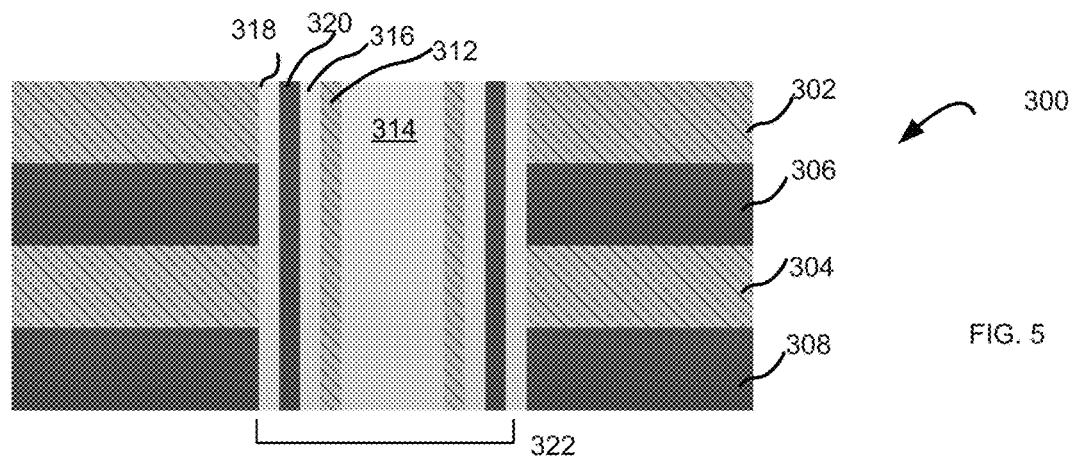

In FIG. 5, the memory device 300 is depicted subsequent to memory cell stack 322 formation in the space 310. More specifically, materials consisting of oxide, nitride and polysilicon are deposited to create the top oxide, storage node, tunnel oxide, and channel of memory cells inside. Such formation may be provided, e.g., by the process of atomic layer deposition (ALD). As shown, the memory cell stack 322 includes layers of semi-conductive material 312 (e.g., polysilicon), coupled with dielectric layers 314, 316 (e.g., oxide, such as SiO2), as shown. The dielectric layer 316 is the tunneling oxide through which electronic charge is transferred between the channel (layer 312) and the storage layer 320 during a write and erase operation. Layer 320 (e.g., nitride, or a combination of oxide and nitride) may be the charge storage layer where programming charge is trapped or de-trapped for programming or erasing of the memory cell. Layer 318 is the blocking layer between the storage layer 320 and the control gates (324, 326) and may include oxide or other high k dielectrics (e.g., HfOx) or a combination of them.

Figure 6:
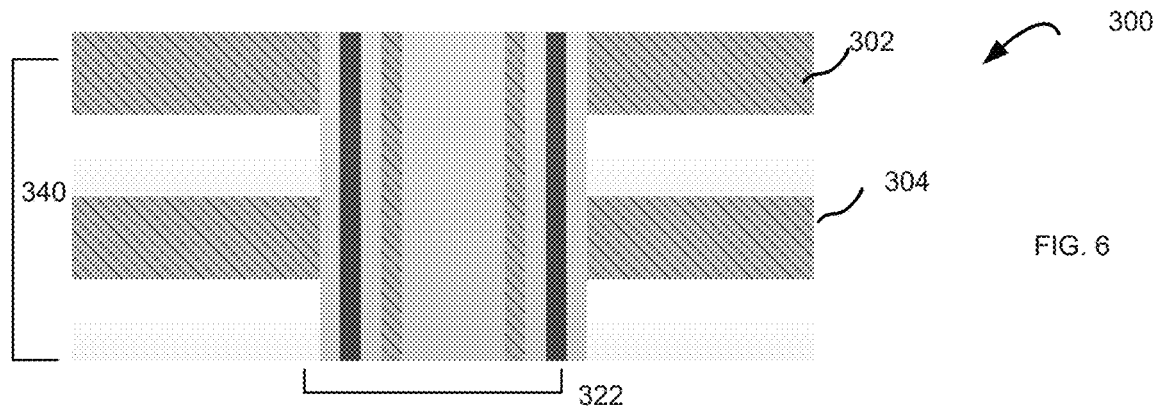

In FIG. 6, the memory device 300 is depicted subsequent to removal of the disposable layers 308, 306 from the structure 340. Such removal may be performed to provide a replacement gate for the memory cell stack 322.

Figure 7:
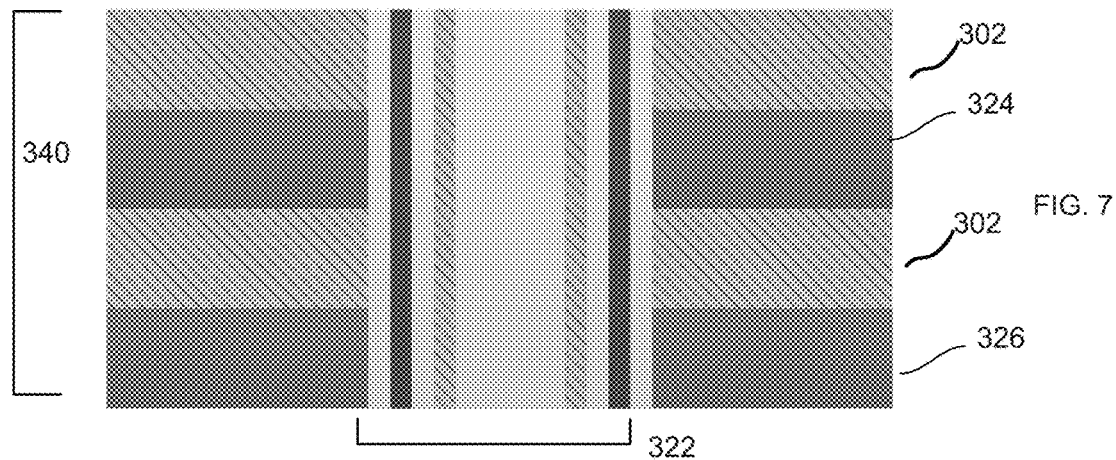

In FIG. 7, the memory device 300 is depicted subsequent to a deposition of material to form wordlines to the structure 340. The wordlines include respective gates to control respective memory cells of the memory cell stack 322, coupled with the wordlines. More specifically, the material forming control gates 324, 326 may be deposited between respective polysilicon layers 302, 304 to fill the gaps left after removal of layers 306, 308, and to create the gates of the NAND memory array. In embodiments, the material comprises a metal, such as tungsten (W) or any other suitable material. Accordingly, the gates may comprise a metal.

Figure 8:
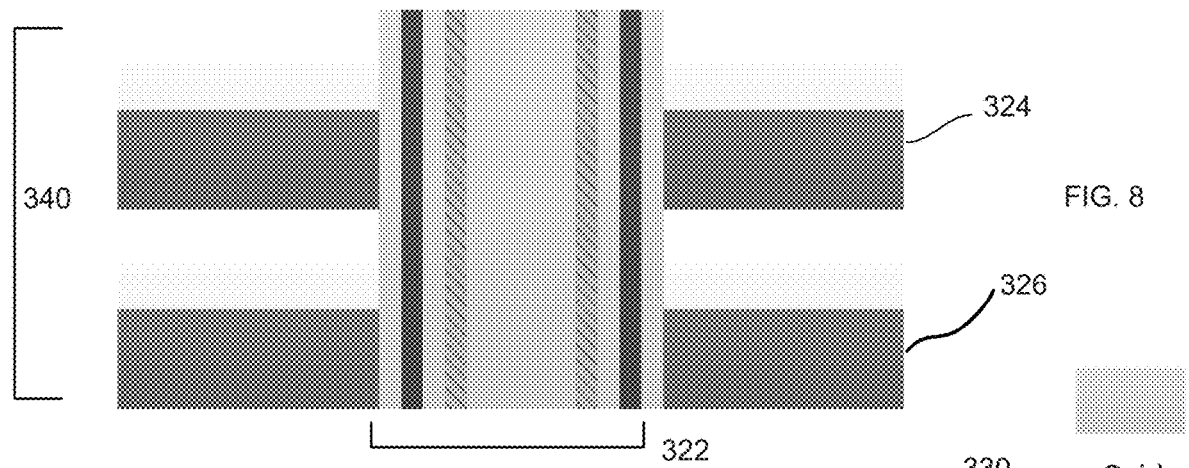

In FIG. 8, the memory device 300 is depicted subsequent to removal of polysilicon layers 302, 304 from the structure 340. The removal may be performed, e.g., by chemical etching.

Figure 9:
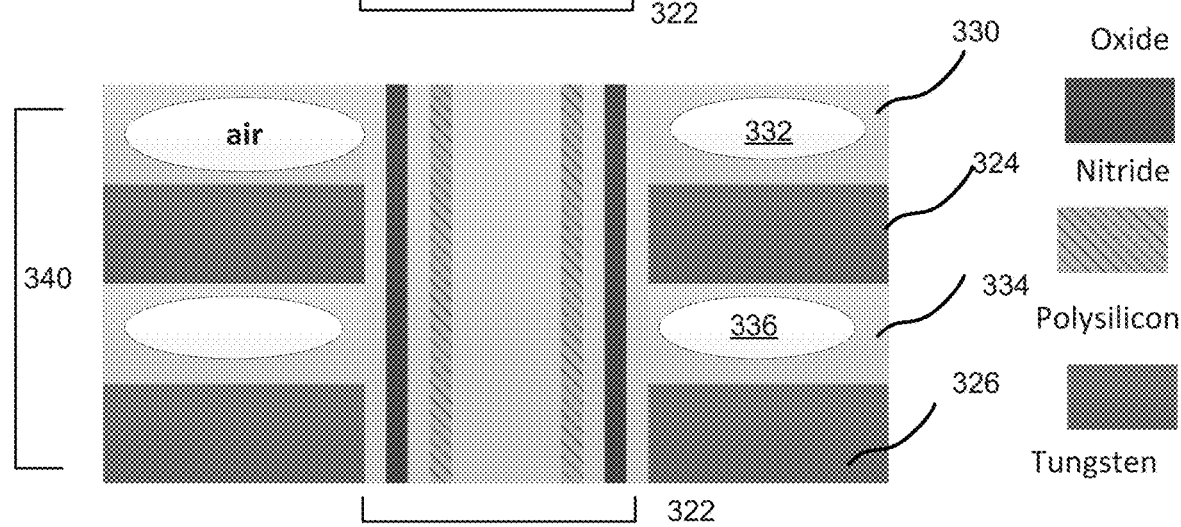

In FIG. 9, the memory device 300 is depicted subsequent to providing dielectric layers with components configured to reduce capacitance of the structure 340. More specifically, dielectric layers 330, 334 are provided to fill the gaps left by the removal of the polysilicon layers 302, 304 from the structure 340. The dielectric layers 330, 334 may be provided by the process of airgap isolation fill, for example. As shown, the dielectric layers 330, 334 include respective components 332, 336. In some embodiments, the components 332, 336 may comprise air gaps inside the layers 330, 334. For example, dielectric layers 330, 334 may be deposited with process conditions that may not fully fill the gaps, and may leave air gaps 332, 336. In some embodiments, the components 332, 336 may comprise dielectric materials with a low dielectric constant, e.g., low-k dielectric material. More generally, layers 330, 334 with respective components 332, 336 may comprise composites of dielectric materials with different dielectric constants, in order to reduce capacitance of the memory device. For example, one of the dielectric constants of the dielectric material comprising the composite can be lower than the other one. For example, the dielectric constant of the component 332 may be lower than that of the respective layer 330. In some embodiments, dielectric layers 330, 334 may have low-k values. In other words, dielectric layers 330, 334 may comprise components 332, 336 and have low-k dielectric material.

FIGS. 10-14 describe another example process of forming a memory device with reduced capacitance, in accordance with some embodiments. More specifically, FIGS. 10-14 illustrate the process of forming a memory array with polysilicon gates, with reduced capacitance, in accordance with some embodiments.

Figure 10:
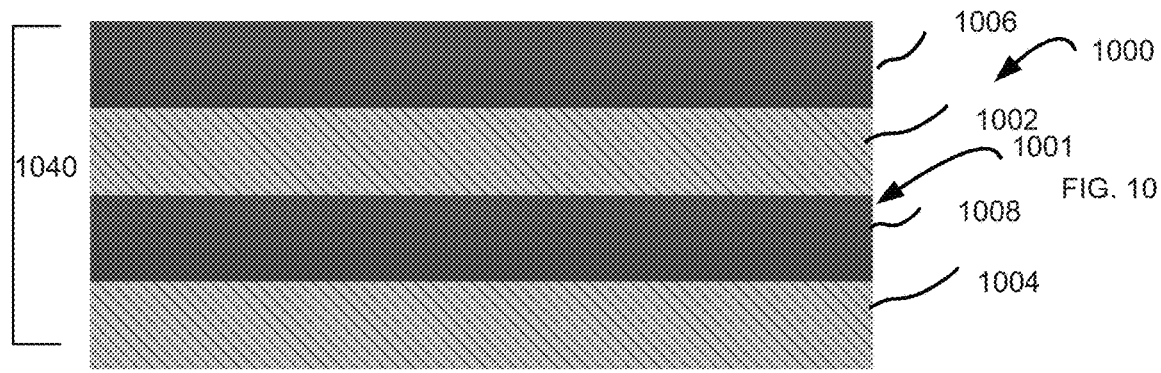

Referring to FIG. 10, a memory device 1000 is depicted subsequent to a tier deposition of layers that may form a plurality of wordlines, comprising at least in part a memory array in a die 1001. More specifically, the memory device 1000 is depicted subsequent to a deposition of polysilicon layers 1002, 1004 with respective disposable layers 1006, 1008 (e.g., comprising nitride or other suitable material) between the polysilicon layers, to form a layered structure 1040, similar to the process described in reference to FIG. 3.

Figure 11:
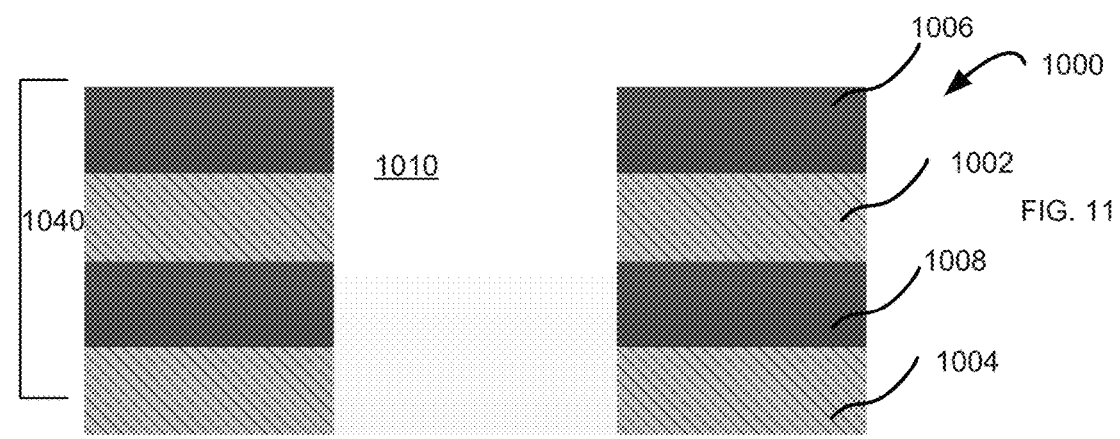

In FIG. 11, the memory device 1000 is depicted subsequent to etching spaces to form pillars (e.g., space 1010) inside the layered structure 1040 of FIG. 10, similar to the process described in reference to FIG. 4.

Figure 12:
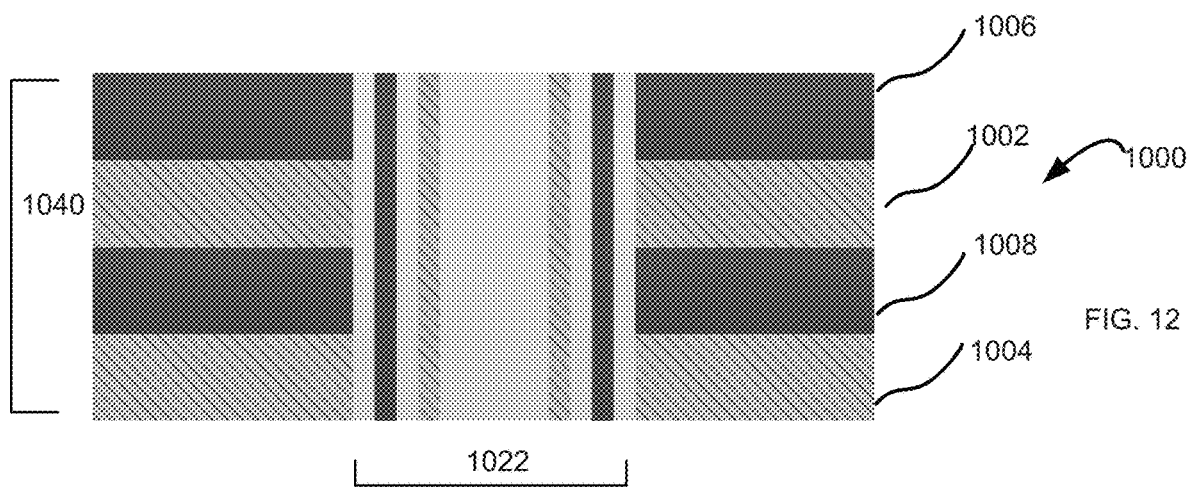

In FIG. 12, the memory device 1000 is depicted subsequent to memory cell stack 1022 formation, similar to the process described in reference to FIG. 5.

In FIG. 13, the memory device 1000 is depicted subsequent to removal of the disposable layers 1006, 1008 from the structure 1040, similar to the process described in reference to FIG. 6. As shown, the resulting structure comprises multiple polysilicon layers 1002, 1004, to form polysilicon gates to electronically control the memory cells of the memory cell stack 1022.

In FIG. 14, the memory device 1000 is depicted subsequent to providing dielectric layers with components configured to reduce capacitance of the structure 1040, similar to the process described in reference to FIG. 9. More specifically, dielectric layers 1030, 1034 are provided to fill the gaps left by the removal of the disposable layers 1006, 1008 from the structure 1040. As shown, the dielectric layers 1030, 1034 include respective components 1032, 1036. In some embodiments, the components 1032, 1036 may comprise air gaps inside the layers 1030, 1034. In some embodiments, the components 1032, 1036 may comprise dielectric materials with a low dielectric constant, e.g., low-k dielectric material.

Other actions related to formation of the memory devices 300 or 1000 may also be performed. For example, a capping layer may be deposited on top of the memory array. The capping layer may include a silicon nitride (SiN), deposited by chemical vapor deposition (CVD), e.g., about 20-30 nm thick. The thickness of the capping layer may be based on chemical mechanical polishing/planarization (CMP) for the ability to polish the memory array with sufficient over/under polish margin. In some embodiments, the capping layer may be any low temperature film (e.g., below 320 C), including, but not limited to, oxide, polymer, titanium nitride (TiN), or the like.

Figure 15:
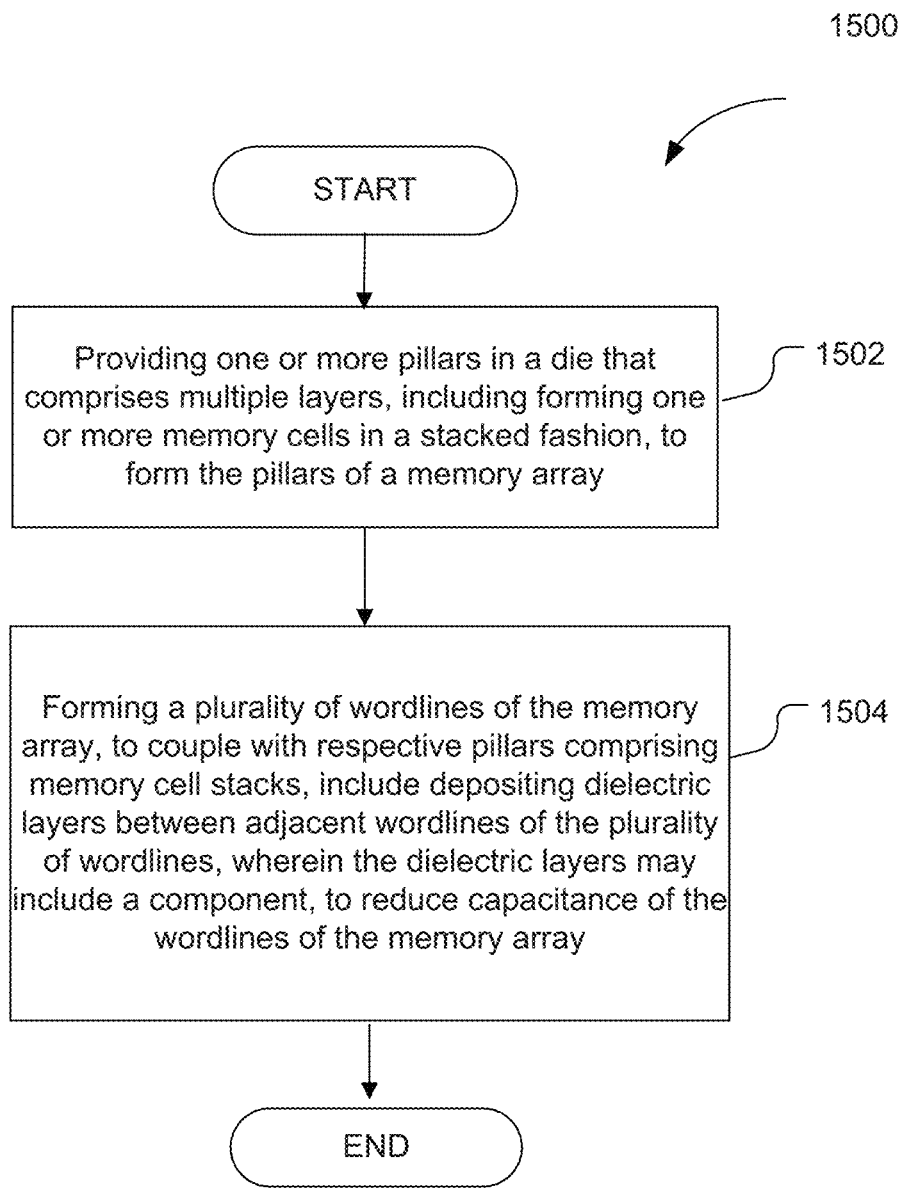
FIG. 15 is a process flow diagram for providing a memory device with reduced capacitance, in accordance with some embodiments.

FIG. 15 is a process flow diagram for providing a memory device with reduced capacitance, in accordance with some embodiments. The process 1500 may comport with actions described in connection with FIGS. 3-14 in some embodiments. As noted above, the process 1500 may apply to formation of wordlines or bitlines in a memory array in accordance with embodiments described herein. The application of the process 1500 to formation of wordlines is provided for purposes of illustration and for ease of understanding.

At block 1502, the process 1500 includes providing one or more pillars in a die that comprises multiple layers, including forming one or more memory cells in a stacked fashion, to form the pillars of a memory array.

At block 1504, the process 1500 further includes forming a plurality of wordlines of the memory array, to couple with respective pillars comprising memory cell stacks. Forming a plurality of wordlines may include various processes, such as dry etch, cleaning, deposition of a liner, and provision of a disposable layer for structural integrity purposes. Forming the wordlines further includes depositing dielectric layers between adjacent wordlines of the plurality of wordlines. In some embodiments, the dielectric layers include a component provided inside the dielectric layer, to reduce capacitance of the wordlines of the memory array. In embodiments, such component may include an air gap or a low-k dielectric material disposed inside the dielectric layer. In embodiments, the wordlines may include a gate to control memory cells coupled with the wordlines. The gates may comprise a metal or a silicon-based material, such as polysilicon.

Various operations of the process 1500 are described as multiple discrete operations, in a manner that is most helpful in understanding the claimed subject matter. However, the order of description should not be construed as to imply that these operations are necessarily order dependent. It will be appreciated that the sequence of operations associated with the process 1500 may vary and/or include other actions in accordance with the present disclosure.

The described embodiments provide a number of advantages compared to conventional solutions. For example, replacing continuous dielectric layers between wordlines of a memory array with partial dielectric layers, e.g., dielectric layers having an air gap inside them or low-k material disposed inside them, may reduce the overall wordline capacitance. This may improve the memory device performance by reducing the time required to operate the memory device.

The described embodiments may be implemented in a three-dimensional memory array, such as a 3D NAND memory array. In some embodiments, the partial dielectric layers between the wordlines provided according to the embodiments described herein may be implemented in a two-dimensional memory array, such as a 2D NAND memory array.

The memory arrays and methods described herein may be implemented into a system using any suitable hardware and/or software to configure as desired.

Figure 16:
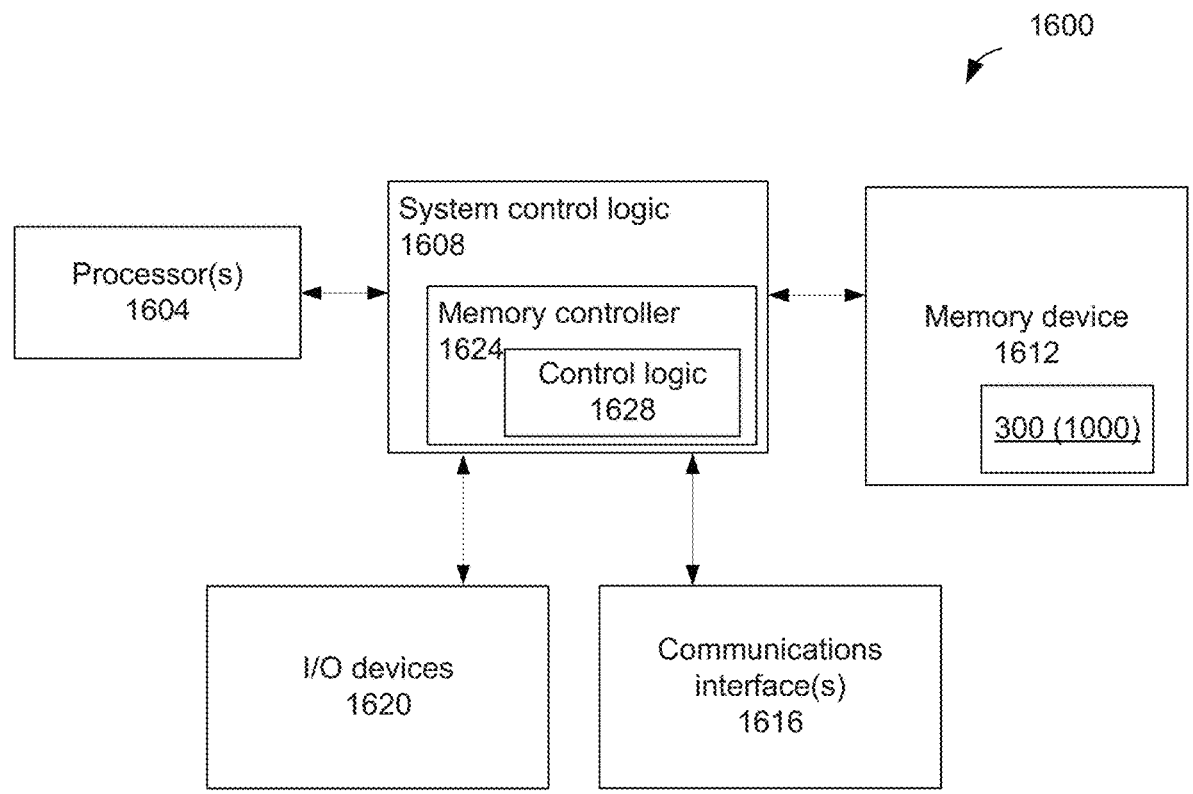
FIG. 16 schematically illustrates an example computing device including a memory device with reduced capacitance, in accordance with some embodiments.

FIG. 16 schematically illustrates an example computing device including a memory device with reduced capacitance, in accordance with some embodiments. The computing device 1600 includes system control logic 1608 coupled to one or more processor(s) 1604; a memory device 1612 having a memory device 300 (1000) described in reference to FIGS. 3-15; one or more communications interface(s) 1616; and input/output (I/O) devices 1620.

The memory device 1612 may be a non-volatile computer storage chip (e.g., provided on the die 102 of FIGS. 1-2) that may include the memory device 300 (1000) of FIGS. 3-15. In embodiments, the memory device 1612 comprises a package, such as IC assembly 200 of FIG. 2, having the memory device 300 (or 1000) disposed therein, driver circuitry (e.g., drivers), input/output connections to electrically couple the memory device 1612 with other components of the computing device 1600, etc. The memory device 1612 may be configured to be removably or permanently coupled with the computing device 1600.

Communications interface(s) 1616 may provide an interface for computing device 1600 to communicate over one or more network(s) and/or with any other suitable device. Communications interface(s) 1616 may include any suitable hardware and/or firmware. Communications interface(s) 1616 for one embodiment may include, for example, a network adapter, a wireless network adapter, a telephone modem, and/or a wireless modem. For wireless communications, communications interface(s) 1616 for one embodiment may use one or more antennas to communicatively couple the computing device 1600 with a wireless network.

For one embodiment, at least one of the processor(s) 1604 may be packaged together with logic for one or more controller(s) of system control logic 1608. For one embodiment, at least one of the processor(s) 1604 may be packaged together with logic for one or more controllers of system control logic 1608 to form a System in Package (SiP). For one embodiment, at least one of the processor(s) 1604 may be integrated on the same die with logic for one or more controller(s) of system control logic 1608. For one embodiment, at least one of the processor(s) 1604 may be integrated on the same die with logic for one or more controller(s) of system control logic 1608 to form a System on Chip (SoC).

System control logic 1608 for one embodiment may include any suitable interface controllers to provide for any suitable interface to at least one of the processor(s) 1604 and/or to any suitable device or component in communication with system control logic 1608. The system control logic 1608 may move data into and/or out of the various components of the computing device 1600.

System control logic 1608 for one embodiment may include a memory controller 1624 to provide an interface to the memory device 1612 to control various memory access operations. The memory controller 1624 may include control logic 1628 that may be specifically configured to control access of the memory device 1612.

In various embodiments, the I/O devices 1620 may include user interfaces designed to enable user interaction with the computing device 1600, peripheral component interfaces designed to enable peripheral component interaction with the computing device 1600, and/or sensors designed to determine environmental conditions and/or location information related to the computing device 1600. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 1616 to communicate with components of a positioning network, e.g., a global positioning system (GPS) satellite.

In various embodiments, the computing device 1600 may be a mobile computing device such as, but not limited to, a laptop computing device, a tablet computing device, a netbook, a smartphone, etc.; a desktop computing device; a workstation; a server; etc. The computing device 1600 may have more or fewer components, and/or different architectures. In further implementations, the computing device 1600 may be any other electronic device that processes data.

According to various embodiments, the present disclosure describes a number of examples.

Example 1 is an apparatus, comprising: a memory array formed in a die, wherein the memory array includes one or more pillars and a plurality of wordlines coupled with the one or more pillars, wherein adjacent wordlines of the plurality of wordlines are separated by respective dielectric layers, wherein the dielectric layers include respective components provided to reduce capacitance of the plurality of wordlines.

Example 2 may include the apparatus of Example 1, wherein the components include an air gap provided inside the dielectric layers.

Example 3 may include the apparatus of Example 1, wherein the components include a low-k dielectric material.

Example 4 may include the apparatus of Example 1, wherein each of the one or more pillars comprise one or more memory cells formed in a stacked fashion.

Example 5 may include the apparatus of Example 1, wherein a wordline of the plurality of wordlines includes a gate to control a memory cell coupled with the wordline, wherein the gate comprises one of: a metal or a silicon-based material.

Example 6 may include the apparatus of Example 5, wherein the metal comprises tungsten (W).

Example 7 may include the apparatus of Example 5, wherein the silicon-based material comprises polysilicon.

Example 8 may include the apparatus of Example 1, wherein the memory array comprises a three-dimensional (3D) NAND memory array.

Example 9 may include any of the apparatuses of Examples 1-8, wherein the apparatus comprises an integrated circuit.

Example 10 is a computing system, comprising: a processor; and a memory coupled with the processor, wherein the memory includes a memory array formed in a die, wherein the memory array includes one or more pillars and a plurality of wordlines coupled with the one or more pillars, wherein adjacent wordlines of the plurality of wordlines are separated by respective dielectric layers, wherein the dielectric layers include respective components provided to reduce capacitance of the plurality of wordlines.

Example 11 may include the computing system of Example 10, wherein the components include an air gap provided inside the dielectric layers.

Example 12 may include the computing system of Example 10, wherein the components include a low-k dielectric material.

Example 13 may include the computing system of Example 10, wherein each of the one or more pillars comprise one or more memory cells formed in a stacked fashion.

Example 14 may include the computing system of Example 10, wherein a wordline of the plurality of wordlines includes a gate to control a memory cell coupled with the wordline, wherein the gate comprises one of: a metal or a silicon-based material.

Example 15 may include any of the computing systems of Examples 10 to 14, wherein the computing system is a mobile computing device.

Example 16 is a method, comprising: forming one or more pillars comprising memory cells in a die, to form a memory array; and providing a plurality of wordlines to couple with respective ones of the one or more pillars, including separating adjacent wordlines of the plurality of wordlines by respective dielectric layers, and forming respective components in the dielectric layers, to reduce capacitance of the plurality of wordlines.

Example 17 may include the method of Example 16, wherein forming the components includes providing an air gap inside the dielectric layers.

Example 18 may include the method of Example 16, wherein forming the components includes providing the dielectric layers with low-k dielectric material.

Example 19 may include the method of Example 16, wherein providing the plurality of wordlines includes, for a wordline, forming a gate to control a memory cell coupled with the wordline, wherein the gate comprises one of: a metal or a silicon-based material.

Example 20 may include any of the methods of Examples 16 to 19, wherein the memory array comprises a three-dimensional (3D) NAND memory array.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
a memory array formed in a die, wherein the memory array includes one or more pillars and a plurality of wordlines coupled with the one or more pillars,
wherein adjacent wordlines of the plurality of wordlines are separated by respective dielectric layers, wherein the dielectric layers include composites of dielectric materials, wherein a composite includes a first dielectric material with a first dielectric constant and a second dielectric material with a second dielectric constant, wherein the first and second dielectric constants comprise low-k dielectric constants, wherein the composite is free from an air gap, wherein the first dielectric constant is lower than the second dielectric constant, wherein the first dielectric material is disposed completely inside the second dielectric material, wherein the composite is provided to reduce capacitance of the plurality of wordlines.

2. The apparatus of claim 1, wherein each of the one or more pillars comprise one or more memory cells formed in a stacked fashion.

3. The apparatus of claim 1, wherein a wordline of the plurality of wordlines includes a gate to control a memory cell coupled with the wordline, wherein the gate comprises one of: a metal or a silicon-based material.

4. The apparatus of claim 3, wherein the metal comprises tungsten (W).

5. The apparatus of claim 3, wherein the silicon-based material comprises polysilicon.

6. The apparatus of claim 1, wherein the memory array comprises a three-dimensional (3D) NAND memory array.

7. The apparatus of claim 1, wherein the apparatus comprises an integrated circuit.

8. A computing system, comprising:
a processor; and
a memory coupled with the processor, wherein the memory includes a memory array formed in a die, wherein the memory array includes one or more pillars and a plurality of wordlines coupled with the one or more pillars, wherein adjacent wordlines of the plurality of wordlines are separated by respective dielectric layers, wherein the dielectric layers include composites of dielectric materials, wherein a composite includes a first dielectric material with a first dielectric constant and a second dielectric material with a second dielectric constant, wherein the first and second dielectric constants comprise low-k dielectric constants, wherein the composite is free from an air gap, wherein the first dielectric constant is lower than the second dielectric constant, wherein the first dielectric material is disposed completely inside the second dielectric material, wherein the composite is provided to reduce capacitance of the plurality of wordlines.

9. The computing system of claim 8, wherein each of the one or more pillars comprise one or more memory cells formed in a stacked fashion.

10. The computing system of claim 8, wherein a wordline of the plurality of wordlines includes a gate to control a memory cell coupled with the wordline, wherein the gate comprises one of: a metal or a silicon-based material.

11. The computing system of claim 8, wherein the computing system is a mobile computing device.

12. A method, comprising:
forming one or more pillars comprising memory cells in a die, to form a memory array; and
providing a plurality of wordlines to couple with respective ones of the one or more pillars, including separating adjacent wordlines of the plurality of wordlines by respective dielectric layers, wherein the dielectric layers include composites of dielectric materials, wherein a composite includes a first dielectric material with a first dielectric constant and a second dielectric material with a second dielectric constant, wherein the first and second dielectric constants comprise low-k dielectric constants, wherein the composite is free from an air gap, wherein the first dielectric constant is lower than the second dielectric constant, wherein the first dielectric material is disposed completely inside the second dielectric material, wherein the composite is provided to reduce capacitance of the plurality of wordlines.

13. The method of claim 12, wherein providing the plurality of wordlines includes, for a wordline, forming a gate to control a memory cell coupled with the wordline, wherein the gate comprises one of: a metal or a silicon-based material.

14. The method of claim 12, wherein the memory array comprises a three dimensional (3D) NAND memory array.

* * * * *